United States Patent [19]

Rosenberg et al.

[11] Patent Number: 4,896,069
[45] Date of Patent: Jan. 23, 1990

[54] PIEZOELECTRIC SWITCH

[75] Inventors: Armand Rosenberg, Rehovot; Menashe Yeheskel, Yavne, both of Israel

[73] Assignee: Makash - Advanced Piezo Technology, Israel

[21] Appl. No.: 199,701

[22] Filed: May 27, 1988

[51] Int. Cl.$^4$ .......................................... H01L 41/08
[52] U.S. Cl. ..................................... 310/339; 310/363; 341/34; 200/600
[58] Field of Search ................. 310/328, 339, 330-331, 310/340, 345, 365, 366, 363, 364; 340/365 A; 200/181

[56] References Cited

U.S. PATENT DOCUMENTS

| | | | |
|---|---|---|---|
| 2,258,967 | 10/1941 | Bokovoy | 310/348 |
| 2,385,896 | 10/1945 | Von Beckerath | 310/365 X |
| 2,575,819 | 11/1951 | Laird | 310/351 |
| 3,390,287 | 6/1968 | Sonderegger | 310/366 X |
| 3,503,031 | 3/1970 | Nyhus et al. | 338/99 |
| 3,885,173 | 5/1975 | Lee | 310/345 |
| 3,899,698 | 8/1975 | Kleinschmidt | 310/339 X |
| 4,047,060 | 9/1977 | Schafft | 310/322 |
| 4,190,785 | 2/1980 | Kompanek | 310/330 |
| 4,201,435 | 5/1980 | Nakamura et al. | 339/59 M |
| 4,221,444 | 9/1980 | Patrick | 339/17 M |
| 4,234,813 | 11/1980 | Iguchi et al. | 310/366 |
| 4,252,391 | 2/1981 | Sado | 339/60 R |
| 4,267,480 | 5/1981 | Kanematsu et al. | 310/363 X |
| 4,296,406 | 10/1981 | Pearson | 340/166 R |
| 4,322,652 | 3/1982 | Otsuka | 310/363 X |
| 4,328,441 | 5/1982 | Kroeger, Jr. et al. | 310/319 |
| 4,344,662 | 8/1982 | Dalamangas et al. | 339/59 M |
| 4,360,754 | 11/1982 | Toyoshima et al. | 310/366 |
| 4,412,210 | 10/1983 | Wahizuka et al. | 340/365 S |
| 4,430,595 | 2/1984 | Nakasone et al. | 310/339 |
| 4,433,223 | 2/1984 | Larson et al. | 200/159 B |
| 4,532,451 | 7/1985 | Inoue | 310/353 |
| 4,539,554 | 9/1985 | Jarvis et al. | 310/339 X |
| 4,618,797 | 10/1986 | Cline | 310/339 |
| 4,737,767 | 4/1988 | Kompanek et al. | 310/345 X |

FOREIGN PATENT DOCUMENTS

| | | | |
|---|---|---|---|
| 2445805 | 4/1976 | Fed. Rep. of Germany | 310/339 |
| 0058391 | 5/1977 | Japan | 310/339 |
| 1573394 | 8/1980 | United Kingdom | . |

Primary Examiner—Mark O. Budd
Attorney, Agent, or Firm—Browdy & Neimark

[57] ABSTRACT

A piezoelectric switch including a casing for receiving an external mechanical force, a piezoelectric ceramic for sensing the external mechanical force received by the casing and converting the force to an electrical signal, the ceramic having one side connected to the casing and another side having both the positive and the negative poles, a conductive rubber connector disposed adjacent to and in contact with the ceramic for conducting the electrical signal and a printed circuit board disposed adjacent to and in contact with the conductive member for receiving and processing the conducted electrical signal received from the ceramic and for preventing any electrical signals from passing from the circuit board through the conductive member to the piezoelectric ceramic.

8 Claims, 3 Drawing Sheets

PIEZOELECTRIC SWITCH

BACKGROUND OF THE INVENTION

1. Field of the Invention

The present invention relates to a piezoelectric switch having no moving parts, particularly for use in keyboards. The switch includes a piezoelectric ceramic, having both contacts on one side, and an electronic circuit using an anisotropic elastomer as a conductive linking media to convert mechanical force to an electrical signal.

2. The Prior Art

Known switches of the type used in keyboards, for example, computer keyboards or telephone keypads, are constructed of a number of moving parts. These type of switches frequently break down due to the fragile nature of the parts and must be frequently cleaned to prevent damage due to dust and dirt.

U.S. Pat. No. 4,737,767 discloses a keyboard, shown in FIG. 1, which consists of a number of keyswitches having no moving parts so as to eliminate the previously mentioned disadvantages. The keyboard casing 2 is formed of a hard non-insulating material. A layer 6 of epoxy is applied to the casing 2 which transmits the force imposed on the different keyboard areas 4. A number of thin electrically insulating sheets 8 are attached to the hard non-insulating material at individual areas 4 in the housing representing the characters on the keyboard. A plurality of thin electrically conductive sheets 10 are attached to the thin insulating sheets 8, which together constitute printed curcuit segments. A number of ceramic piezoelectric crystals 14 are attached to the individual conductive sheets 10 with a small amount of epoxy 12 and the conductive sheets 10 are thus electrically coupled to the housing. In this way, one surface of the crystal is common to the individual area of the housing and when the keyboard area is depressed, the crystal becomes stressed and causes an electrical signal to be generated on the ungrounded surface of the crystal. Leads 16 are attached to the ungrounded surface of the crystals 14 and carry the electrical signal to the outside world. An insulating layer 18 overlays the crystals 14 and the conductive sheets 10.

Switches of this type have a number of disadvantages. They are complicated in structure, and thus are difficult and costly to manufacture. Because the individual parts must be soldered or glued together, they are difficult to replace or repair. In addition to the many layers of this switch, the ceramic has contacts on opposite sides thereof, thus making electrical contact therewith difficult and complex. Furthermore, in order to construct an entire keyboard, it is necessary to use individual ceramics and corresponding insulating and conductive layers. Additionally, the printed circuit is located between the crystal and the hard insulating material, thus resulting in the possibility of damage to the printed circuit.

The use of piezoelectric ceramics having both contacts on one side in electric circuits is known. Examples of patents disclosing such an arrangement are as follows.

| U.S. Pat. No. | Inventor | U.S. Pat. No. | Inventor |
| --- | --- | --- | --- |
| 3,885,173 | Lee | 3,390,287 | Sonderegger |
| 2,575,819 | Laird | 2,385,896 | Von Beckerath |
| 2,258,967 | Bokovoy | | |

Also known is the use of a conductive rubber gasket either as connecting links or in association with a piezoelectric ceramic, examples of which are found in the following patents.

| U.S. Pat. No. | Inventor | U.S. Pat. No. | Inventor |
| --- | --- | --- | --- |
| 4,532,451 | Inoue et al. | 4,360,754 | Toyoshima et al. |
| 4,322,652 | Otsuka | 4,267,480 | Kanematsu et al. |
| 4,344,662 | Dalamangas et al. | 4,252,391 | Sado |
| 4,221,444 | Patrick | 4,201,435 | Nakamura et al. |
| 3,885,173 | Lee | | |

Only Lee discloses the use of a conductive rubber gasket in conjunction with a piezoelectric ceramic having both contacts on one side. Lee is directed to a device for mechanically and electrically coupling an acoustical surface wave device to a housing. The device includes a conducting rubber gasket connected between an acoustical surface wave device and an electronic circuit within a housing. The acoustical surface wave device acts as a filter, which allows information to pass through the circuit when the carrier corresponds with the frequency of the wave. The circuitry connected to the piezoelectric ceramic is for feeding signals to the ceramic, rather than being solely for receiving signals from the ceramic. Thus, the device in Lee cannot function as a key switch as in the present invention.

SUMMARY OF THE INVENTION

It is an object of the present invention to provide a switch which has no moving parts and is simple and inexpensive to manufacture, produce and repair.

It is further object of the present invention to provide a switch which includes a piezoelectric ceramic having both contacts on one side and an electronic circuit using an anisotropic elastomer as a conductive media to convert mechanical force to an electric signal.

Still other objects, features and attendant advantages of the present invention will become apparent to those skilled in the art from a reading of the following detailed description of the embodiments constructed in accordance therewith, taken in conjunction with the accompanying drawings.

BRIEF DESCRIPTION OF THE DRAWINGS

The invention of the present application will now be described in more detail with reference to the preferred embodiments of the device, given only by way of example, and with reference to the accompanying drawings, in which.

DETAILED DESCRIPTION OF THE PREFERRED EMBODIMENTS

The piezoelectric switch according to the present invention is designed to provide a simple, inexpensive switch which can be used in a wide number of applications. For example, individual switches, can be used to construct a computer keyboard, a telephone keypad, a cash register terminal, a control panel for machinery, elevator buttons, or any other device which requires a user to input information.

Figure 2:
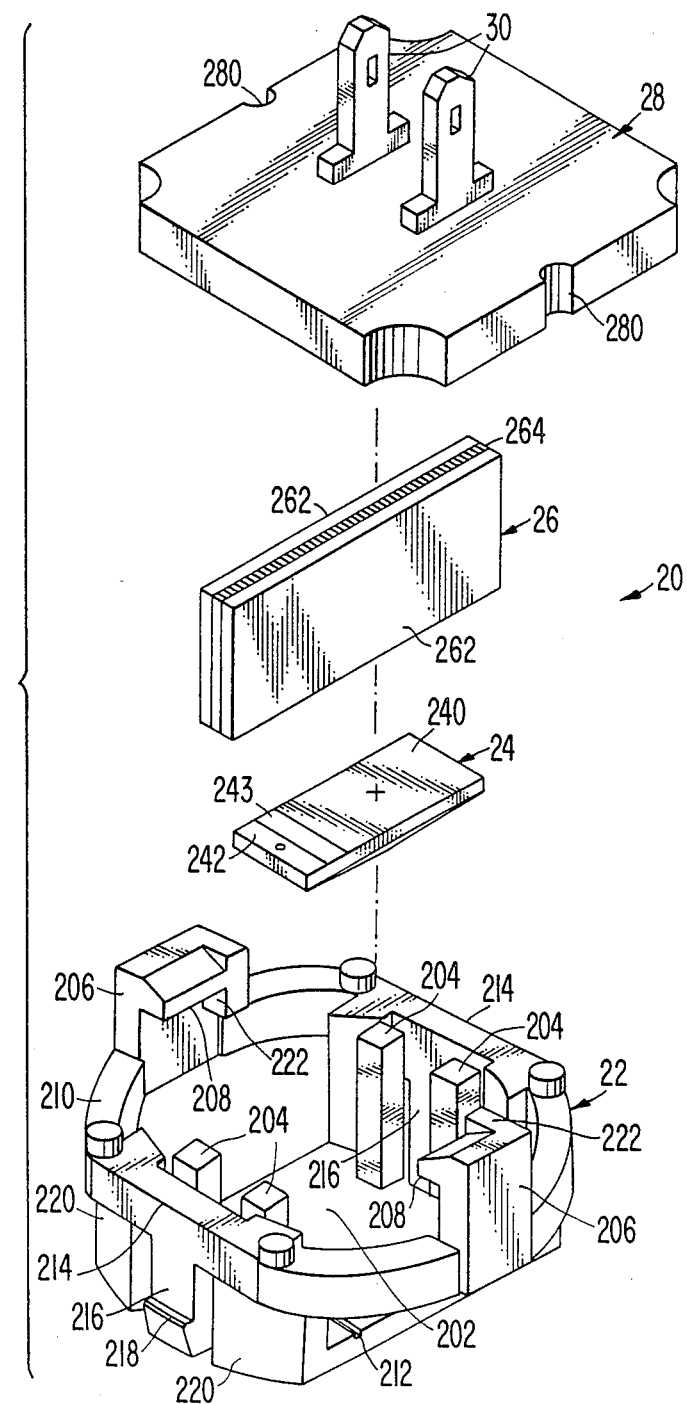
FIG. 2 illustrates an exploded view of the piezoelectric switch according to the present invention.

Piezoelectric switch 20 of the present invention is shown in an exploded view in FIG. 2. Housing 22 forms a receptacle into which the remainder of the circuit elements are inserted. Housing 22 is formed of a material which is rigid but somewhat flexible, for example, plastic or stainless steel. One example of such a plastic material is the product sold under the trademark LEX-AN ® manufactured by General Electric Company.

The material must be sufficiently flexible so that it is deformable in response to external pressure which is applied to activate the switch. For example, if the switch is to be used as a telephone keypad, the person would press the indicia for the number he is entering. The pressure caused thereby would deform the housing, which transformation in turn would be transmitted to the piezoelectric ceramic 24. It also must be sufficiently flexible to allow such fitting of the various switch elements within the housing and to allow such fitting of the housing in the device in which it is to be used. The material must also be sufficiently rigid so as to protect the piezoelectric ceramic from damage.

Housing 22 includes a ring shaped support 210 on which all other portions of the housing are attached. Support 210 has a substantially circular shape, however, two portions form flattened portions 214. Descending from one surface of support 210, at portions 214, are two clips 216 which can be used to removably secure the switch to the device in which it is being used. These clips 216 are squeezed toward one another during insertion and, when in place, flange 218 acts to secure the switch to the device (not shown).

Also descending from support 210 at approximately the position of the flattened portions 214 are supports 220 which form supports for bridge 202. Four posts 204 are attached to bridge 202 on the inside of support 210. Two of the posts 204 are positioned adjacent to each flattened portion 214 and are spaced from one another along the respective flattened portion. The amount of spacing is sufficient to allow an anisotropic conductive rubber element 26 (described below) to be inserted therebetween. Groove 212 is formed in the inside surface of bridge 202.

Posts 206 extend from the opposite surface of support 210 at positions 90° from flattened portions 214. Posts 206 include inwardly facing flanges 208 which act to keep printed circuit board 28 in place when the switch is assembled. The printed circuit board 28 snaps into place within the housing 22. Cutouts 280 on printed circuit board 28 engage portions 222 of posts 206 when the switch is assembled to assure correct positioning of the switch elements within housing 22.

Figure 1:
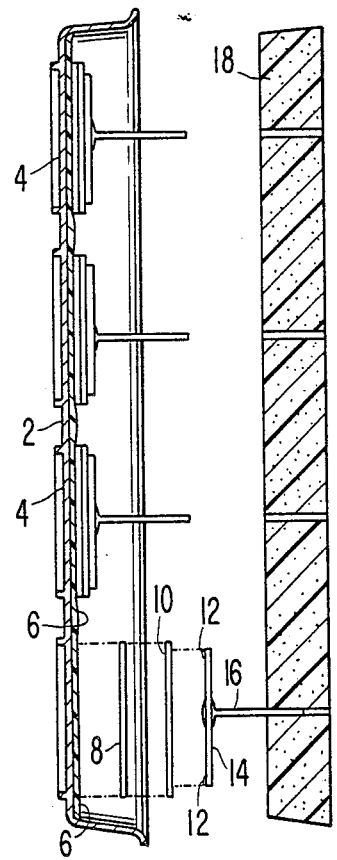
FIG. 1 illustrates the construction of the prior art piezoelectric keyboard.
Figure 3:
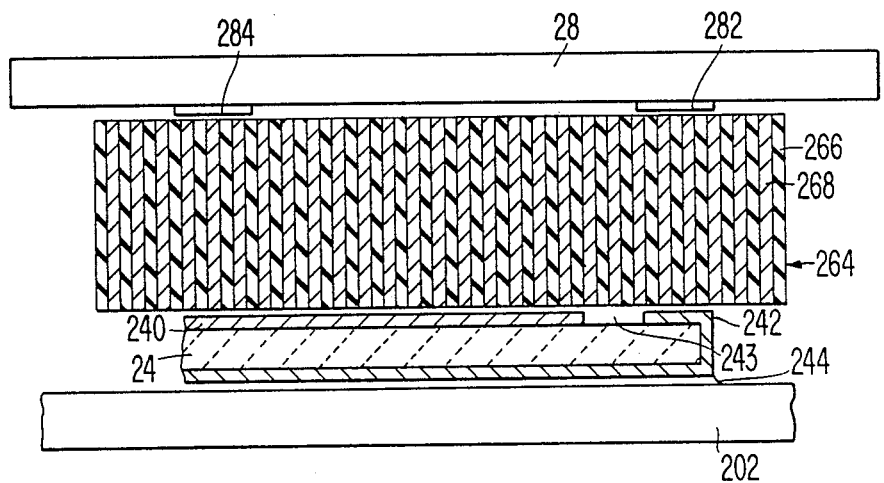
FIG. 3 is a cross-sectional view of the elements of the switch according to the present invention.

Piezoelectric ceramic element 24 is fixed to the undersurface of bridge 202 by an insulating adhesive 244 (FIG. 3). Both the positive and the negative contacts, 240 and 242, respectively, are located on the side of the ceramic which is not fixed to bridge 202. A gap 243 is formed between poles 240 and 242. In this way, by providing both contacts on one side, the ceramic is easily electrically connected to the remainder of the circuit elements. The polarity of the poles is interchangeable.

The ceramic element 24 can be made from a standard ceramic material. In the preferred embodiment, PPK21 is used, manufactured by Stettner & Co. of Lauf, Federal Republic of Germany. The piezoelectric ceramic exhibits a high coupling factor, high permittivity, high piezoelectric strain constant and broadband behavior through low mechanical Q-factor.

The anisotropic conductive elastomeric connector 26 is disposed so as to have one longitudinal edge extend across the longitudinal exposed face of the piezoelectric element 24. The connector 26 is inserted into the housing 22 in the space formed by posts 204. The connector is held within the housing by the printed circuit 28 when the board is snapped into place. Connector 26 may be any anisotropic conductive elastomeric material but is preferably a Series 1000/2000 ZEBRA ® connector manufactured by Tecknit Co., of Cranford, N.J. Such a connector is formed as a sandwich, in which a conductive portion 264 is layered between two insulating layers 262. Conductive portion 264 is constructed of strips of insulating material 266 alternating with strips of conductive material 268, shown in FIG. 3.

In this particular case the positive pole 240 of the piezoelectric ceramic is linked electrically through the conductive portions 268 of connector 26 to contact 284 of printed circuit board 28. Negative pole 242 is linked electrically to contact 282. The anisotropicity caused by the alternating conductive and insulating strips 268, 266 permits electrical connection of the respective contacts without permitting short-circuiting of contacts of opposite polarity.

The use of such an elastomeric connector facilitates the snap fitting of the component into the housing 22 and protects the piezoelectrc ceramic 24 from physical shock which may come from the direction of the open side of the housing 22. Furthermore, the combination of the elastomeric connector with the piezoelectric ceramic having both poles on one side allows all electrical connections between the ceramic and the printed circuit board to be solder-free.

Figure 4:
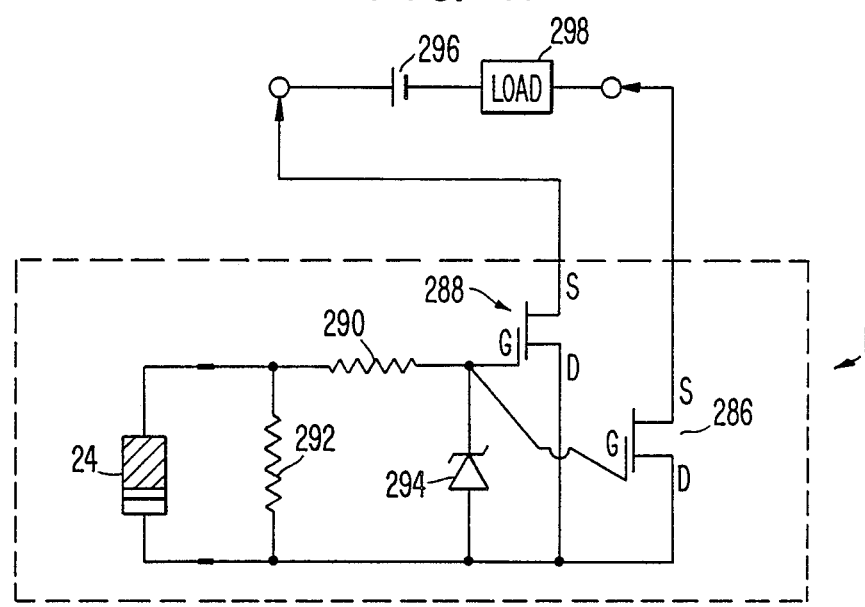
FIG. 4 is a schematic of the circuit contained on the printed circuit board according to the present invention.

FIG. 4 is a schematic of the circuit of printed circuit board 28. The circuit 1 forming the piezoelectric switch according to the present invention is shown outlined in broken lines. The circuit prevents any electrical signal from passing from the printed circuit board through anisotropic conductive elastomeric connector to the piezoelectric ceramic 24 and also transmits any electrical signal received from the ceramic 24 to the outside world. In particular, the circuit includes two resistors 290 and 292, two transistors 286 and 288 and a diode 294. When an electrical signal develops within the piezoelectric ceramic, from a mechanical force exerted on the switch, the gates of the transistors 286 and 288 are polarized positively. The impedance between the source and the drain of transistors 286 and 288 falls from 5 M$\Omega$(Typ) to approximately 0$\Omega$. This will enable any external circuit which includes a source (battery 296) and a load 298 to be switched on.

The signal from the piezoelectric crystal 24 is sufficiently high to open the gates of the transistors 286 and 288. However, sometimes this signal is too high, which will overload the two transistors. Diode 294 is included to maintain the signal at a safe level.

Contacts 30 are provided on the outside surface of printed circuit baord 28 to provide contact with the external device. The contacts may be plug terminals as shown in FIG. 2 or they may be formed as straight pin contacts.

Figure 5:
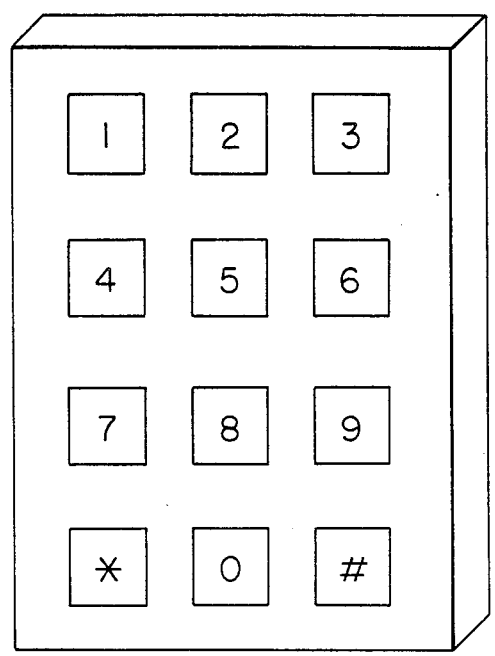
FIG. 5 is a perspective view of a keyboard according to the present invention.

One embodiment of the switch is shown and described herein. A number of switches could be connected together to form a keyboard or other similar device, for example in the keyboard shown in FIG. 5. The individual switches would be connected together to form a keyboard according to known principles of keyboard construction. It is understood that it would be possible to construct other embodiments of the switch which are designed to implement a particular application. For example, it would be possible to provide a single housing which would form the entire keyboard, with indicia for the keyboard characters on one side of the housing, and, for each area having an indicia, an individual piezoelectric element, elastomeric conductor and printed circuit board could be fixed thereto.

It is understood that the shape of the housing 22 may be adapted to the particular needs of the application. For example, it may be square, rectangular or oval. The construction of the switch, and the ease with which the parts of the switch are assembled in the housing, yields a switch which is fully modular. It is a self-contained element which has no moving parts, is easy to assemble and easily snaps into place in the system in which it is to be used.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. A piezoelectric switch comprising:
    casing means for receiving an external mechanical force;
    piezoelectric means for sensing the external mechanical force received by said casing means and converting said force to an electrical signal, said piezoelectric means having one side connected to said casing means and another side having a positive pole and a negative pole;
    anisotropic elastomeric connector means disposed adjacent to and in contact with said piezoelectric means for conducting the electrical signal; and
    circuit means disposed adjacent to and in contact with said conductive means for receiving and processing the conducted electrical signal received from said piezoelectric means and for preventing any electrical signals from passing from said circuit means through said conductive means to said piezoelectric means.

2. The piezoelectric switch according to claim 1, wherein said casing means comprises a rigid flexible and insulating body for encasing said piezoelectric means, said conductive means and said circuit means so that they are in operative contact with one another.

3. The piezoelectric switch according to claim 1, wherein said piezoelectric means comprises a piezoelectric ceramic.

4. The piezoelectric switch according to claim 1, wherein said circuit means comprises a printed circuit board comprising two transistors connected in parallel with respect to one another and a diode having one end connected to the drains of said two transistors and a second end connected to the gates of said two transistors for preventing overload of said two transistors.

5. The piezoelectric switch according to claim 1, further comprising contact means connected to said circuit means for providing contact between the switch and an external circuit.

6. In a keyboard comprising at least two switches and means for processing the outputs of said switches, the improvement wherein each of said switches comprises a piezoelectric switch according to claim 1.

7. The piezoelectric switch according to claim 1, wherein said anisotropic elastomeric connector comprises a plurality of conductive layers and a plurality of insulating layers alternatively connected with one another.

8. The piezoelectric switch according to claim 7, wherein said anisotropic connector further comprises two elongated insulating layers extending the entire width and length of the connector and wherein said plurality of conductive layers and said insulating layers are disposed between said two elongated insulating layers.

* * * * *